(12) United States Patent
Yamazaki et al.

(10) Patent No.: US 7,619,478 B2
(45) Date of Patent: Nov. 17, 2009

(54) OPERATIONAL AMPLIFIER HAVING ITS COMPENSATOR CAPACITANCE TEMPORARILY DISABLED

(75) Inventors: Koji Yamazaki, Ibaraki (JP); Takeki Ebina, Tokyo (JP)

(73) Assignee: Oki Semiconductor Co., Ltd., Tokyo (JP)

( * ) Notice: Subject to any disclaimer, the term of this patent is extended or adjusted under 35 U.S.C. 154(b) by 0 days.

(21) Appl. No.: 12/042,567

(22) Filed: Mar. 5, 2008

(65) Prior Publication Data
US 2008/0238497 A1    Oct. 2, 2008

(30) Foreign Application Priority Data
Mar. 28, 2007    (JP)    .............................. 2007-085461

(51) Int. Cl.
*H03F 1/14*    (2006.01)
(52) U.S. Cl. .......................... 330/292; 330/51; 330/260
(58) Field of Classification Search ................... 330/51, 330/253, 255, 260, 265, 292; 345/204
See application file for complete search history.

(56) References Cited

U.S. PATENT DOCUMENTS 6,753,731 B2 *    6/2004    Maki ........................... 330/255

2006/0091955 A1 *    5/2006    Choi ........................... 330/292

FOREIGN PATENT DOCUMENTS

| JP | 6-164263 | 6/1994 |
| JP | 2000091857 A | 3/2000 |
| JP | 2006279512 A | 10/2006 |
| WO | 2006103889 A1 | 10/2006 |

OTHER PUBLICATIONS

Japanese Office Action "Notification of Reason for Refusal" Dated on Feb. 13, 2009 Patent Application No. 2007-085461; with English Translation.

* cited by examiner

*Primary Examiner*—Khanh V Nguyen
(74) *Attorney, Agent, or Firm*—Studebaker & Brackett PC; Donald R. Studebaker

(57) ABSTRACT

An operational amplifier includes a differential amplifier connected between an input and an output port of the operational amplifier, a phase compensator capacitance connected between the differential amplifier and the output port, a switching transistor for controlling the connection between the phase compensator capacitance and the differential amplifier, a detection transistor responsive to a potential difference between the input and output ports to be rendered conductive, and a control transistor responsive to the detection transistor for controlling the switching transistor. The operational amplifier has its slew rate improved without detracting from stability against oscillation and continuity of the output waveform.

9 Claims, 10 Drawing Sheets

OPERATIONAL AMPLIFIER HAVING ITS COMPENSATOR CAPACITANCE TEMPORARILY DISABLED

BACKGROUND OF THE INVENTION

1. Field of the Invention

The present invention relates to an operational amplifier, and more specifically to an operational amplifier for use in a liquid crystal display (LCD) source driver, for instance.

2. Description of the Background Art

Generally, a liquid crystal display source driver has a large number of output operational amplifiers. With the recent tendency towards the large-sized liquid crystal display, it has been desired to improve various characteristics of liquid crystal driving devices. Under those circumstances, the number of the data and scanning lines is accordingly increasing and, in particular, it is desired to elevate the writing speed to liquid crystal capacitances for the scanning lines. Moreover, with increasing competition in the market of liquid crystal display devices, the cost of component parts is necessarily required to decrease. The same is true for driving devices, which are desired to be inexpensive with higher driving performance.

As the technique that possibly satisfies the above requirements, there is a technique disclosed in Japanese patent laid-open Publication No. 164263/1994. This Publication discloses an operational amplifier which accomplishes a high slew rate with its phase margin maintained higher. FIG. 9 is a schematic circuit diagram for simplified illustration of an operational amplifier described in the publication, and FIG. 10 is a timing chart for use in understanding the operation of the operational amplifier shown in FIG. 9. The operational amplifier has switches SW1 and SW2 and a phase compensator capacitance C1. The switch SW1 is turned on responsive to switching of a signal TP1, and at the same time the switch SW2 is turned off responsive to a signal CTRL delivered from outside the chip of the operational amplifier. During the time the phase compensator capacitance C1 is disconnected from an output OUT of the operational amplifier, the output potential is changed acutely. When the signal CTRL is again changed, the switch SW2 is turned on, thereby connecting the phase compensator capacitance C1 to the output. With the above constitution and operation, it is possible to provide for a high slew rate with the phase margin satisfactory.

However, with the above operational amplifier, it is necessary to provide the switch to control the connection between the phase compensator capacitance and the output, and in order to control the switch it is also necessary to deliver the control signal from outside. This control signal needs to be delivered from, for example, a timing controller (T-CON). In order to let the timing controller deliver the control signal, the circuit must be designed with an attention paid to how long the switch is to be turned on or off, thus raising the costs involved in the timing controller and ascribable to the protracted development time period. Since the phase compensator capacitance is kept in its off state for a certain period of time by the control signal and the switch, it is true that the slew rate is improved indeed whereas there is a problem that stability against oscillation as well as continuity in the output waveform may be lost until the phase compensator capacitance is turned on.

SUMMARY OF THE INVENTION

It is therefore an object of the present invention to provide an operational amplifier with which it is possible to improve the slew rate without loosing the stability against oscillation and the continuity in the output waveform as far as possible. It is another object of the invention to provide an operational amplifier advantageously applicable to a liquid crystal display source driver having a large number of output operational amplifiers with its power consumption reduced.

In accordance with the present invention, an operational amplifier includes a differential amplifier connected between an input and an output port of the operational amplifier, a phase compensator capacitance connected between the differential amplifier and the output port, a switching transistor for controlling the connection between the phase compensator capacitance and the differential amplifier, a detection transistor responsive to a potential difference between the input and output ports to be rendered conductive, and a control transistor responsive to the detection transistor for controlling the switching transistor.

According to the present invention, it is thus possible to provide an operational amplifier in which the stew rate may be improved without loss of stability against oscillation and continuity in the output waveform as far as possible.

BRIEF DESCRIPTION OF THE DRAWINGS

The objects and features of the present invention will become more apparent from consideration of the following detailed description taken in conjunction with the accompanying drawings in which.

DESCRIPTION OF THE PREFERRED EMBODIMENTS

Figure 1:
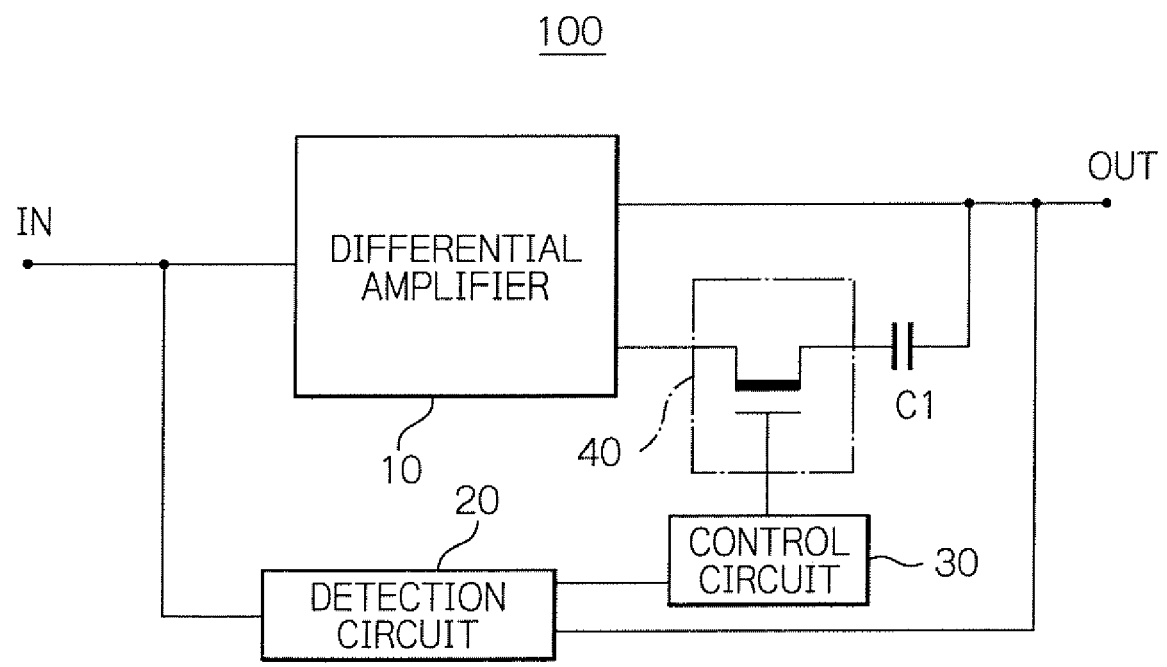
FIG. 1 is a schematic block diagram for illustrating the constitution of an operational amplifier according to an illustrative embodiment of the present invention.

Preferred embodiments in accordance with the present invention will be described below with reference to the accompanying drawings. In the description and drawings, like functional parts and components are designated with identical reference numerals and repetitive descriptions thereon will be omitted.

Figure 2:
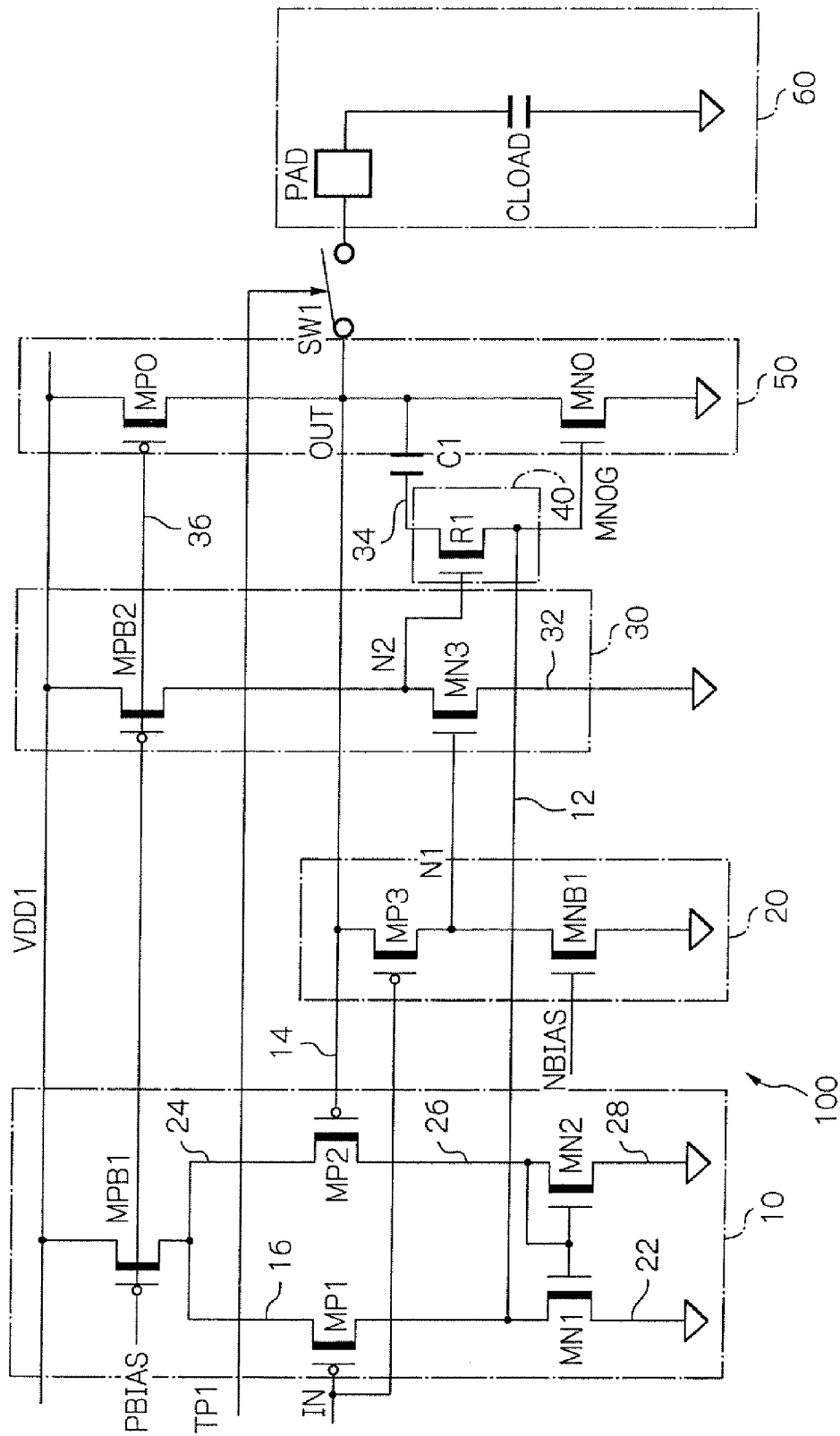
FIG. 2 is a schematic circuit diagram of the operational amplifier according to the embodiment shown in FIG. 1.
Figure 8:
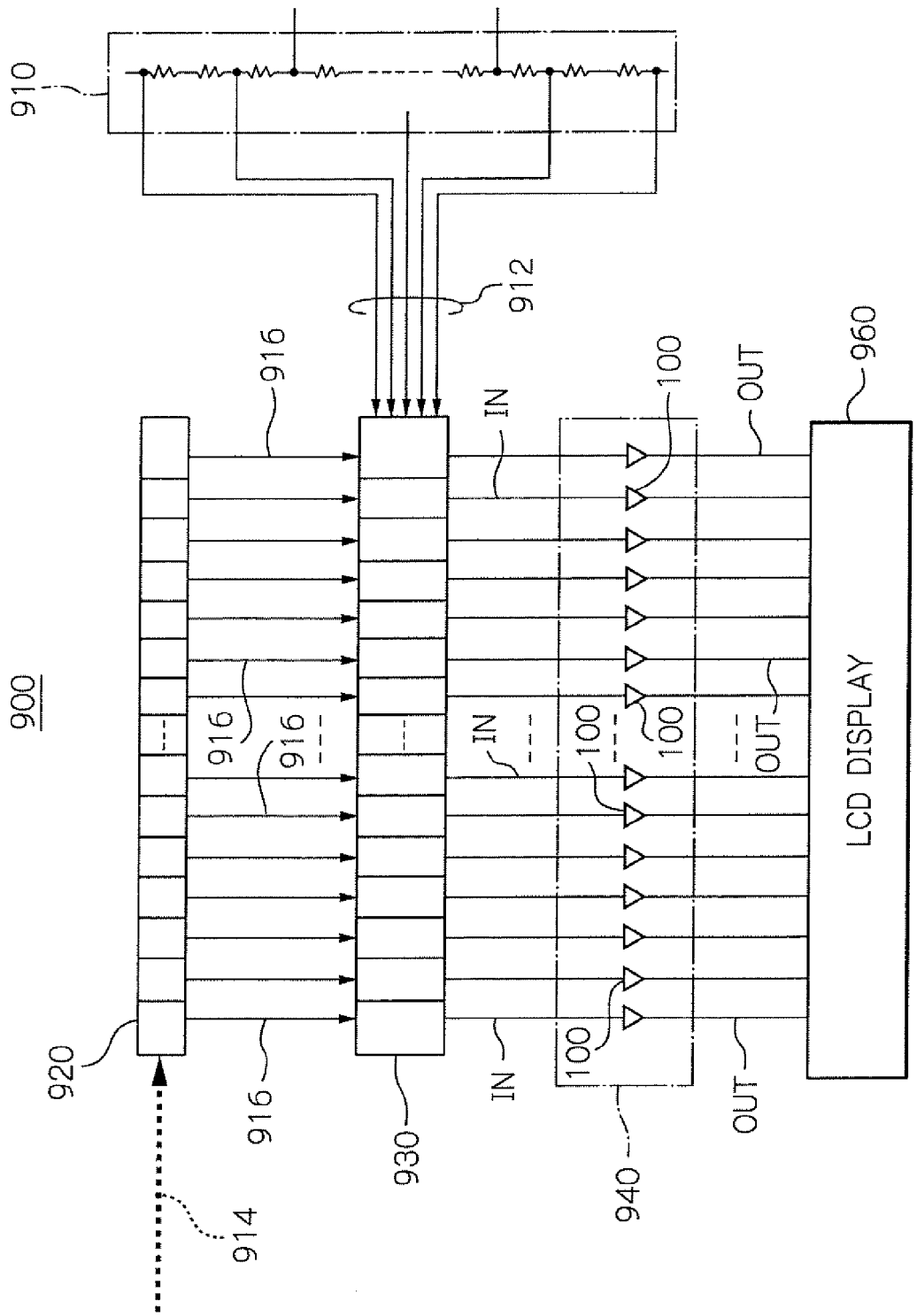
FIG. 8 is a schematic circuit diagram of a driver which includes the operational amplifiers according to the illustrative embodiments.
Figure 9:
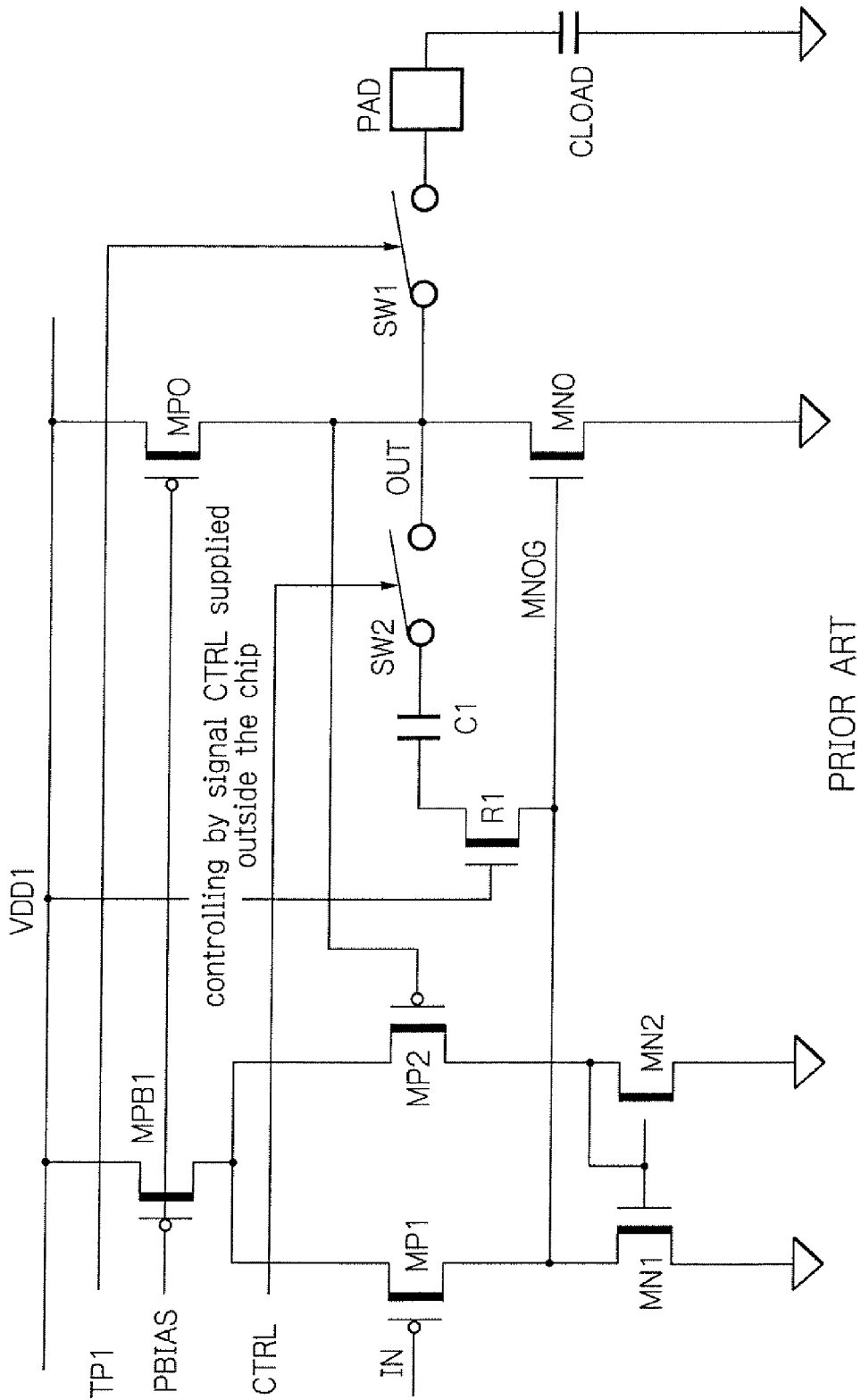
FIG. 9 is a schematic circuit diagram of a conventional operational amplifier.
Figure 10:
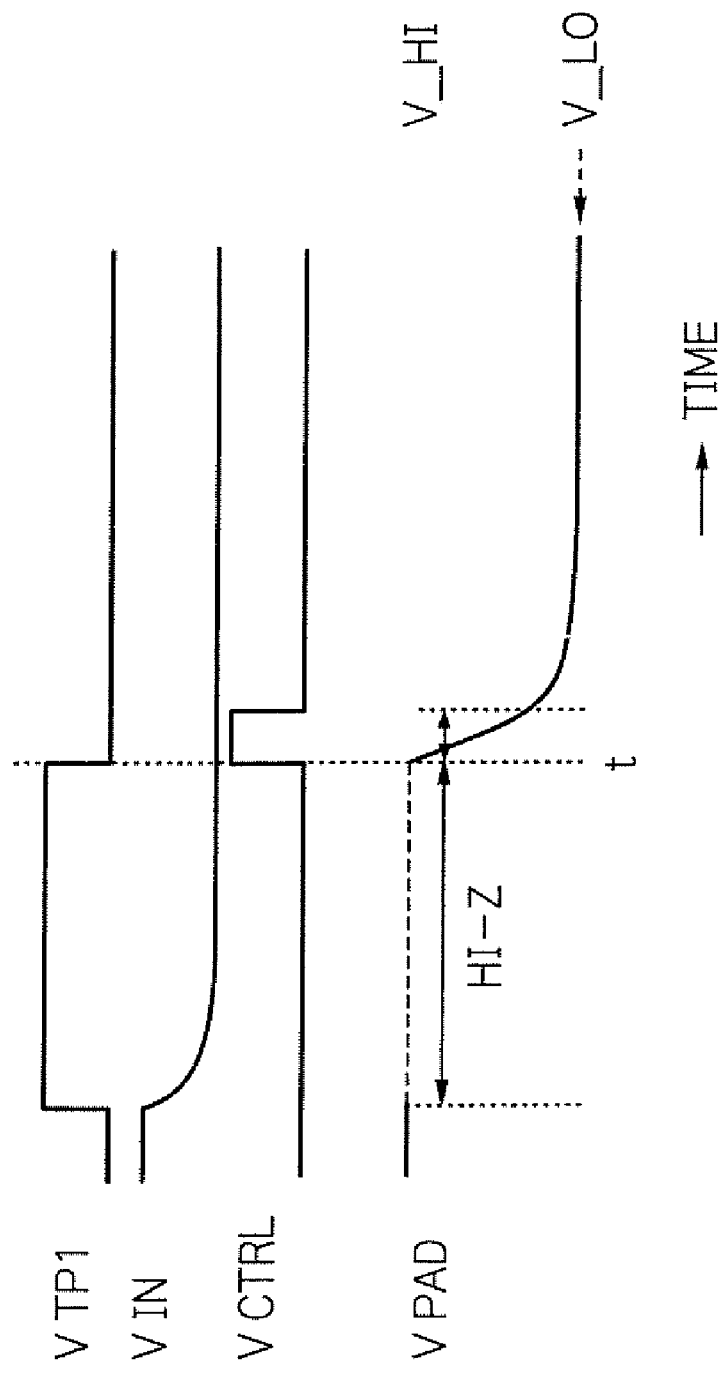
FIG. 10 is a timing chart of the operational amplifier shown in FIG. 9.

With reference to FIGS. 1, 2 and 8, an operational amplifier according to a preferred embodiment of the present invention will be described in detail. FIG. 1 depicts in a schematic block diagram an operational amplifier 100 of the preferred embodiment. As shown, the operational amplifier 100 is made up of a differential amplifier 10, a detection circuit 20 having a detection transistor MP3, FIG. 2, a control circuit 30 having a control transistor MN3, a switching device 40 having a switching transistor R1, and a compensator capacitance C1, which are interconnected as illustrated.

FIG. 2 depicts in a circuit diagram specific circuitry of the operational amplifier 100 of the preferred embodiment of the present invention. The instant embodiment is implemented as an N-channel amplifier adapted to output a voltage lower than a reference voltage. The operational amplifier 100 has its device input IN forming the input of the differential amplifier 10, and its one output 12 forming the output of the amplifier 10 connected via a serial connection of the switching device 40 and the compensator capacitance C1 to the output port OUT of the operational amplifier 100. The output port OUT is connected to another input 14 of the differential amplifier 10 to form a negative feedback path. The detection circuit 20 is connected between the input 14 and the output 12 of the operational amplifier 100. The control circuit 30 is responsive to an output N1 of the detection circuit 20 to deliver a signal N2 to the switching device 40 and controls the latter. In the descriptive portion, signals are designated with reference numerals assigned to nodes or connection where they appear. The switching device 40 and the compensator capacitance C1 are connected in series between the output of the operational amplifier 100 and the output OUT of the amplifier 10. More specifically, the phase compensator capacitance C1 has its one plate connected to the output port OUT, and its other plate 34 connected to a drain electrode of a switching transistor R1 so as to operatively control the electrical connection, or conduction, between the output 12 of the differential amplifier 10 and the output port OUT. The output OUT of the amplifier 10 is also connected to an output circuit 50. The operational amplifier 100 is connected to a liquid crystal display (LCD) element of a display device 60 via the switching device SW1. In FIG. 2, the device 60 is symbolically depicted with a connector pad and the capacitive load CLOAD of the liquid crystal display element.

The differential amplifier 10 includes a transistor MPB1, which has its source electrode connected to a power supply VDD1 and its gate electrode supplied with a bias voltage PBIAS to operate as a current source. The amplifier 10 further includes a transistor MP1, which has its gate electrode connected to the input IN of the operational amplifier 100 and its source electrode 16 connected to the drain electrode of the transistor MPB1, and a transistor MN1, which has its drain electrode 12 connected to the drain electrode of the transistor MP1 and its source electrode 22 connected to a reference level, e.g. grounded. The amplifier 10 also includes a transistor MP2, which has its gate electrode 14 connected to the output OUT of the operational amplifier 100 and its source electrode 24 connected to the drain electrode of the transistor MPB1, and a transistor MN2, which has its drain electrode 26 connected to the drain electrode of the transistor MP2 and its source electrode 28 grounded, for instance. The transistors MN1 and MN2 have the gate electrode thereof connected in common to the drain electrode 26 of the transistor MN2. The output 12 of the amplifier 10 is represented as a node formed between the drain electrode of the transistor MP1 and the drain electrode of the transistor MN1.

The detection circuit 20 includes a detection transistor MP3, which has its gate and source electrodes connected to the input IN and output OUT, respectively, of the operational amplifier 100. The detection circuit 20 also includes a transistor MNB1, which has its drain and source electrodes connected to the drain electrode N1 of the detection transistor MP3 and the ground, respectively, for instance. The transistor MNB1 has its gate electrode supplied with a bias voltage NBIAS. The output of the detection circuit 20 is represented as the node N1 formed between the drain electrode of the transistor MP3 and the drain electrode of the transistor MNB1.

The control circuit 30 includes a transistor MPB2, which has its source electrode connected to the power supply VDD1 and its gate electrode supplied with the bias voltage PBIAS to operate as a current source, and a control transistor MN3, which has its drain electrode N2 connected to the drain electrode of the transistor MPB2 and its source electrode 32 grounded, for instance. The control transistor MN3 also has its gate electrode connected to the node N1 that represents the output of the detection circuit 20. The control circuit 30 has its output functioning as the node N2 interconnected to the drain of the transistors MPB2 and MN3.

The switching device 40 is made up of the switching transistor R1. The transistor R1 has its gate electrode connected to the node N2 and its source electrode connected to the output 12 of the differential amplifier 10. The transistor R1 has its drain electrode 34 connected to the output OUT of the operational amplifier 100 via the compensator capacitance C1. Specifically, the capacitance C1 is connected between the switching transistor R1 and the output OUT of the amplifier 10, i.e. the output of the operational amplifier 100.

The output circuit 50 includes a transistor MPO, which has its source electrode connected to the power supply VDD1, its drain electrode connected to the output OUT of the operational amplifier 100 and its gate electrode 36 supplied with the bias voltage PBIAS to operate as a current source. The output circuit 50 also includes a transistor MNO, which has its source electrode grounded, its drain electrode connected to the output OUT of the amplifier 100 and its gate electrode connected to the output 12 of the differential amplifier 10, for instance. In the following description, the node 12 connected to the gate electrode of the transistor MNO is termed a node MNOG.

Figure 3:
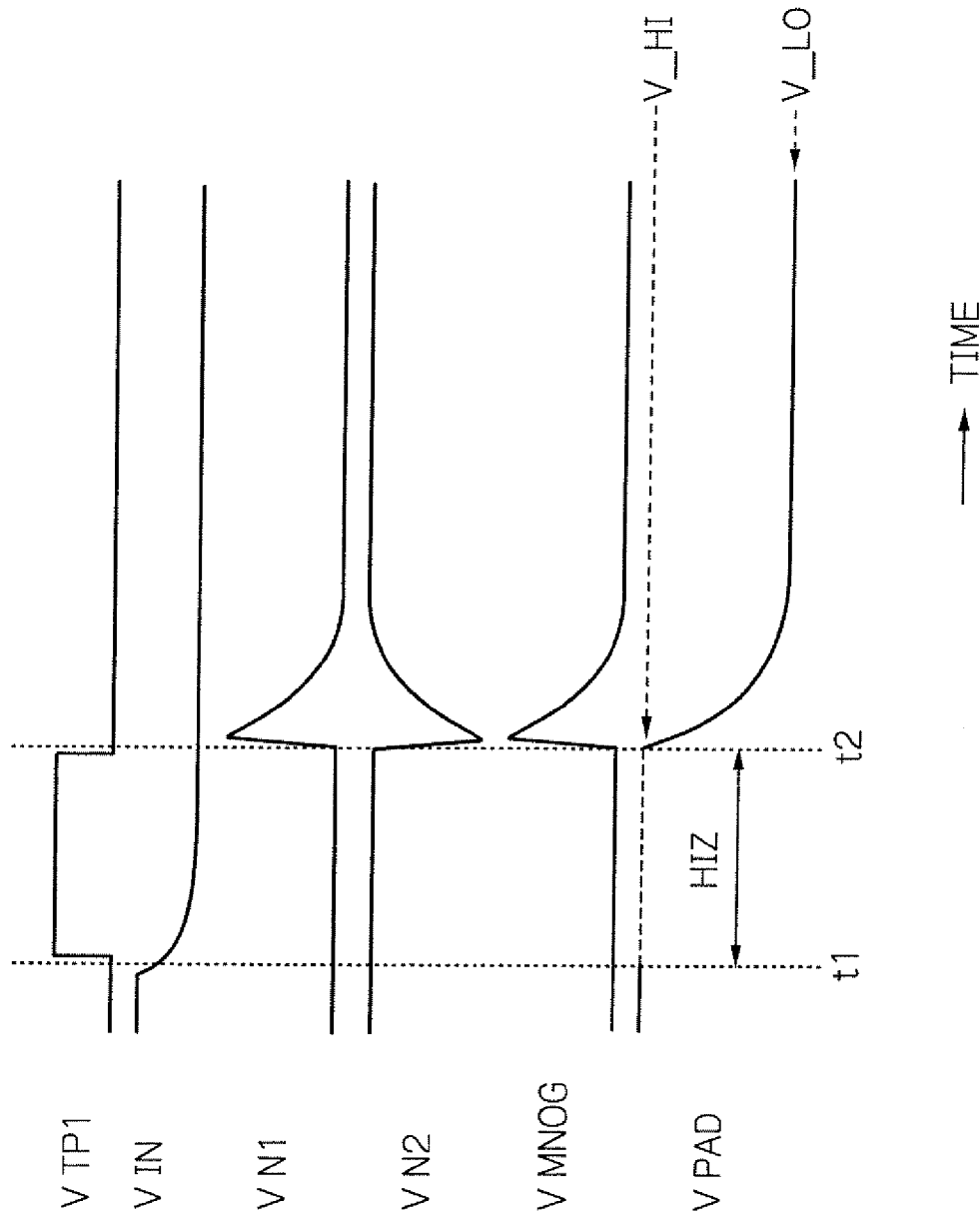
FIG. 3 is a timing chart of the operational amplifier shown in FIG. 2.

The operation will hereinafter be described with reference to FIG. 3, which is a timing chart of the operational amplifier 100. In FIG. 3, a reference code VTP1 denotes a signal that controls the switch SW1. The switch SW1 is provided so as to be rendered off during the HIGH period of the signal VTP1. On the other hand, reference codes VIN, VN1, VN2, VMNOG and VPAD denote an input signal, the potential at the node N1, the potential at the node N2, the potential at the node MNOG and the input potential of the display device 60, respectively.

At time t1, the signal VTP1 goes positive, thus turning the switch SW1 off. At the same time, the input signal IN is changed. For example, the input signal VIN is changed from its HIGH level to LOW. It should be noticed that the input signal is changed to various values depending on input data. Since the switch SW1 is turned off, the input potential of the display device 60 is in its high impedance state (HIZ), with the input potential of the device 60 being scarcely changed even though the input voltage IN is changed.

The signal VTP1 then goes negative at time t2 to turn the switch SW1 on. With the switch SW1 thus turned on, the detection transistor MP3 detects the potential difference between the input IN and the output OUT of the operational amplifier 100, and is turned on, or conductive. With the transistor MP3 thus rendered conductive, the node N1 goes positive instantaneously. The node MNOG also goes positive instantaneously, due to the potential difference between the input IN and the output OUT of the amplifier 100, to turn the transistor MNO on. Since the control transistor MN3 is instantaneously turned on responsive to the positive-going of the node N1, the node N2 goes negative. With the negative-going of the node N2, the switching transistor R1 is turned off, i.e. non-conductive, thus disabling, or disconnecting, the compensator capacitance C1 so far connected to the output OUT of the amplifier 100. Meanwhile, as the potential difference between the input IN and the output OUT of the amplifier 100 decreases, the switching transistor R1 is progressively continuously returned to its on, or conductive, state. On the other hand, the detection transistor MP3, transistor MNO and the control transistor MN3 progressively continuously revert to their steady states with decrease in the potential difference between the input IN and the output OUT of the amplifier 100.

With the above-described embodiment of the present invention, the control signal, which conventionally had to be delivered from outside, can be generated inside the operational amplifier 100 which is thus provided with the detection circuit 20 adapted for detecting the potential difference caused between the input signal IN and the output signal OUT at the time of switching of the signal IN as well as the control circuit 30. Since no external control signal is required, it becomes possible to prevent the cost from increasing which would otherwise be incurred due to the extended development time. Additionally, in distinction from the prior art system which uses the binary signals, that is, HIGH and LOW signals, the above-described embodiment of the present invention can generate a signal corresponding to the potential difference between the input signal IN and the output signal OUT. Concomitantly, the output wave form can continuously be maintained. Since the compensator capacitance C1 is not disconnected, or disabled, for a time longer than necessary, the operational amplifier 100 can maintain stability against oscillation. Since the time provided for disconnecting the compensator capacitance C1 is set so as not to detract from stability against oscillation, the slew rate can naturally be improved. In addition, the steady-state current is not increased, but can remain unchanged from the value of the related art, while at the same time the stability against oscillation as well as the improved slew rate can be achieved.

FIG. 8 shows an exemplified constitution of a driver 900 including an operational amplifier group 940 which is comprised of the operational amplifiers 100 described above for driving a liquid crystal display (LCD) device 960. The driver 900 further includes a decoder 930 having multiple decoder stages, a gradation voltage generator 910 for generating multiple gradation voltages 912 to the decoder 930, and a shift register 920 for sequentially shifting bits of digital data 914 along its register stages and supplying the multiple stages of decoder 930 with respective bits 916. The decoder 930 is supplied with the digital data from outputs 916 of the shift register 920, and latches the respective bits of the data, for instance, to select ones of the analog voltages 912 associated with the digital data 916 in the respective decoder stages. The operational amplifiers 100 included in the group 940 deliver the respective voltages OUT corresponding to the outputs of the decoder 930 to the display device 960, which includes a corresponding number of the display devices 60, FIG. 2. The operational amplifier 100 of the instant embodiment can exhibit its performance when used in the driver 900 shown in FIG. 8.

Figure 4:
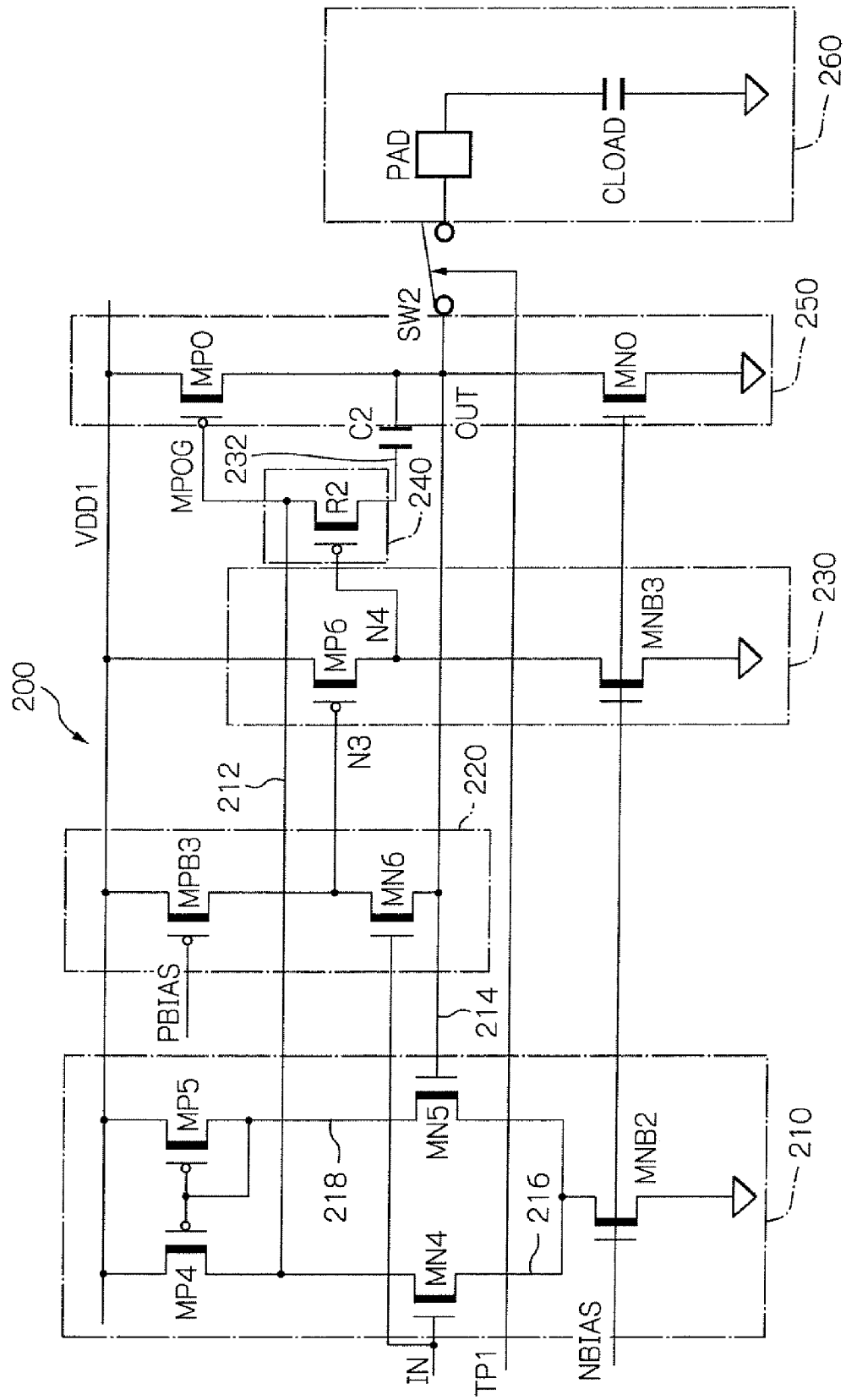
FIG. 4 is a schematic circuit diagram of an operational amplifier according to a modification of the embodiment shown in FIG. 2.
Figure 5:
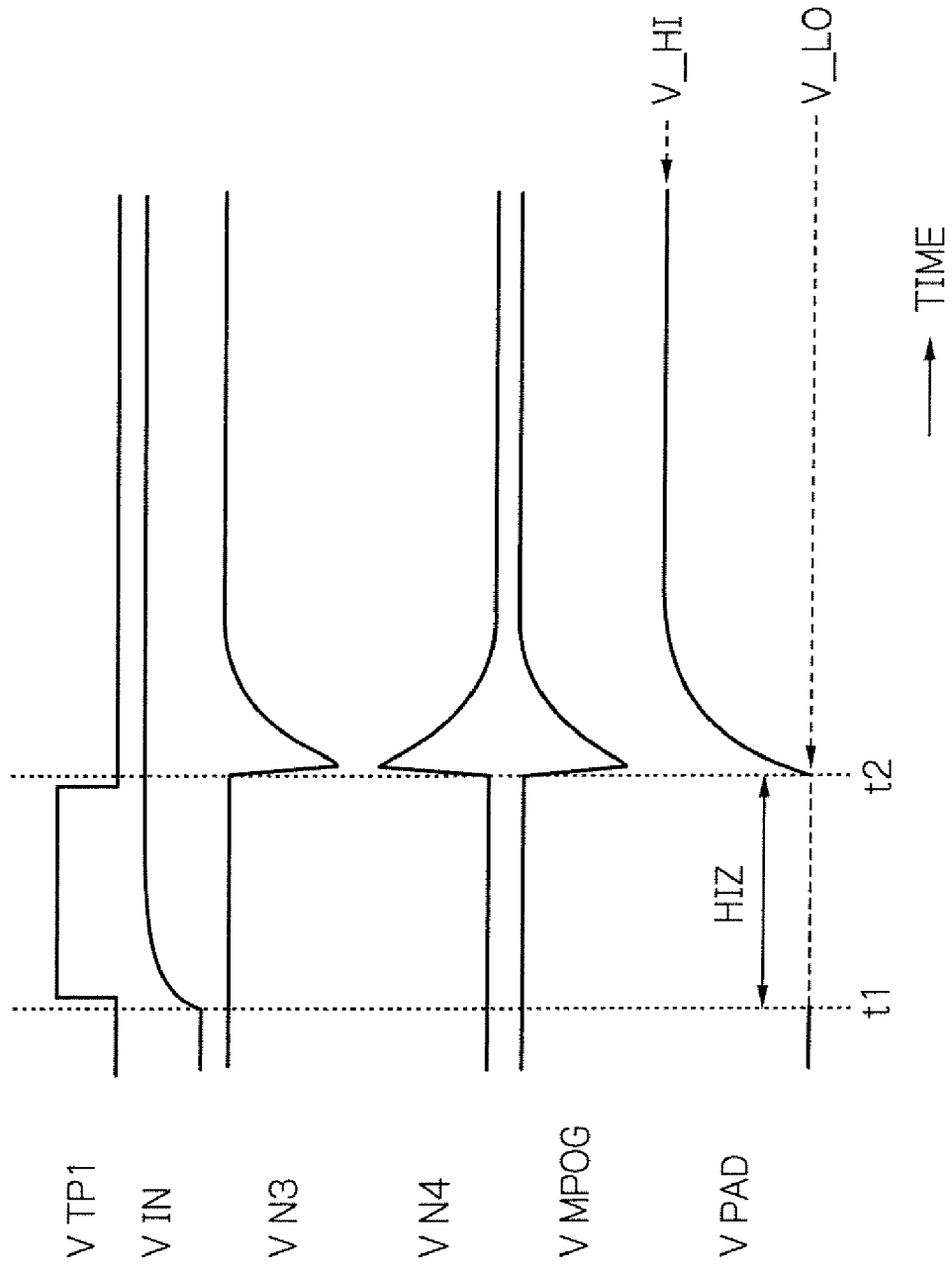
FIG. 5 is a timing chart for the operational amplifier shown in FIG. 4.

A modification of the above-described embodiment will now be described with reference to FIGS. 4 and 5. FIG. 4 is a schematic circuit diagram of an operational amplifier 200 as modified. The above-described embodiment functions as an N-channel amplifier. The present modification, shown in FIGS. 4 and 5, is implemented as a P-channel amplifier. Specifically, the earlier-described embodiment is directed to the amplifier 100 adapted to produce the output OUT higher than its input IN. Conversely, the present modification is directed to a case where the amplifier 200 produces the output OUT lower than its input IN.

FIG. 4 depicts in a schematic circuit diagram the operational amplifier 200 modified. The operational amplifier 200 has its input port IN forming the input of a differential amplifier 210 and its one output 212 forming the output of the differential amplifier 210 connected via a serial connection of a switching device 240 and a compensator capacitance C2 to the output port OUT of the operational amplifier 200. The output port OUT of the operational amplifier 200 is connected to another input port 214 of the differential amplifier 210 in order to form a negative feedback path. The operational amplifier 200 has a detection circuit 220 connected between the input 214 and the output 212 of the amplifier 200. The detection circuit 220 is connected to the input N3 of a control circuit 230, which is adapted to produce a signal N4 in response to the output of the detection circuit 220 to a switching device 240 in order to control the switching device 240. The switching device 240 and the compensator capacitance C2 are connected in series between the output OUT of the operational amplifier 200 and the output 212 of the differential amplifier 210. Further, the output OUT of the differential amplifier 210 is connected to an output circuit 250. The operational amplifier 200 is connected to a display device 260 via a switch SW2. In FIG. 4, the display device 260 is schematically shown with a pad and the capacitive load CLOAD of the liquid crystal display element.

The differential amplifier 210 includes a transistor MNB2, which has its source electrode connected to the ground and its gate electrode supplied with a bias voltage NBIAS, and a transistor MN4, which has its gate electrode connected to the input IN of the operational amplifier 200 and its source electrode connected to the drain electrode 216 of the transistor MNBR2. The differential amplifier 210 further includes a transistor MP4, which has its drain electrode connected to the drain electrode 212 of the transistor MN4 and its source electrode connected to the power supply VDD1, and a transistor MN5, which has its gate electrode connected to the output 214 of the operational amplifier 200 and its source electrode connected to the drain electrode 216 of the transistor MNB2. The amplifier 210 also includes a transistor MP5, which has its drain electrode 218 connected to the drain electrode of the transistor MN5, and its source electrode connected to the power supply VDD1, for instance. The transistors MP4 and MP5 have the gate electrode thereof connected to the drain electrode 218 of the transistor MP5. The output 212 of the differential amplifier 210 is represented as a node between the drain electrode of the transistor MN4 and the drain electrode of the transistor MP4.

The detection circuit 220 includes a detection transistor MN6, which has its gate and source electrodes connected to the input IN and output OUT, respectively, of the operational amplifier 200. The detection circuit 220 also includes a transistor MPB3, which has its drain and source electrodes connected to the drain electrode N3 of the detection transistor MN6 and the power supply VDD1, respectively, for instance. The transistor MPB3 also has its gate electrode supplied with a bias voltage PBIAS. The output of the detection circuit 220 is represented as the node N3 between the drain electrode of the transistor MN6 and the drain electrode of the transistor MPB3.

The control circuit 230 includes a transistor MNB3, which has its source electrode grounded and its gate electrode supplied with the bias voltage NBIAS, and a control transistor MP6, which has its drain electrode N3 connected to the drain electrode of the transistor MNB3 and its source electrode connected to the power supply VDD1, for instance. The control transistor MP6 also has its gate electrode connected to the node N3 that represents the output of the detection circuit 220. The control circuit 230 has its output functioning the node N4 interconnected to the drain of the transistors MNB3 and MP6.

The switching device 240 is made up of a switching transistor R2. The transistor R2 has its gate electrode connected to the node N4, and its source electrode connected to the output 212 of the differential amplifier 210. The transistor R2 has its drain electrode 232 connected to the output OUT of the operational amplifier 200. The compensator capacitance C2 is connected between the switching transistor R2 and the output OUT of the differential amplifier 210, i.e. the output of the operational amplifier 200.

The output circuit 250 includes a transistor MPO, which has its source electrode connected to the power supply VDD1, its drain electrode connected to the output OUT of the operational amplifier 200 and its gate electrode connected to the output 212 of the differential amplifier 210. The output circuit 250 also includes a transistor MNO, which has its source electrode grounded, its drain electrode connected to the output OUT of the amplifier 200 and its gate electrode supplied with the bias voltage NBIAS, for instance. In the following description, the node 212 connected to the gate electrode of the transistor MPO is termed a node MPOG.

Further, FIG. 5 is a timing chart of the operational amplifier 200. In the figure, a reference code VTP1 denotes a signal that controls the switch SW1. The switch SW2 is provided so as to be rendered off during the HIGH period of the signal VTP1. On the other hand, reference codes VIN, VN3, VN4, VMPOG and VPAD denote an input signal, the potential at the node N3, the potential at the node N4, the potential at the node MPOG and the input potential of the display device 260, respectively.

The operation of the present modification is analogous with that of the earlier-described embodiment, and hence repetitive descriptions thereon is omitted. The present modification yields meritorious effects comparable to those of the earlier-described embodiment.

Figure 6:
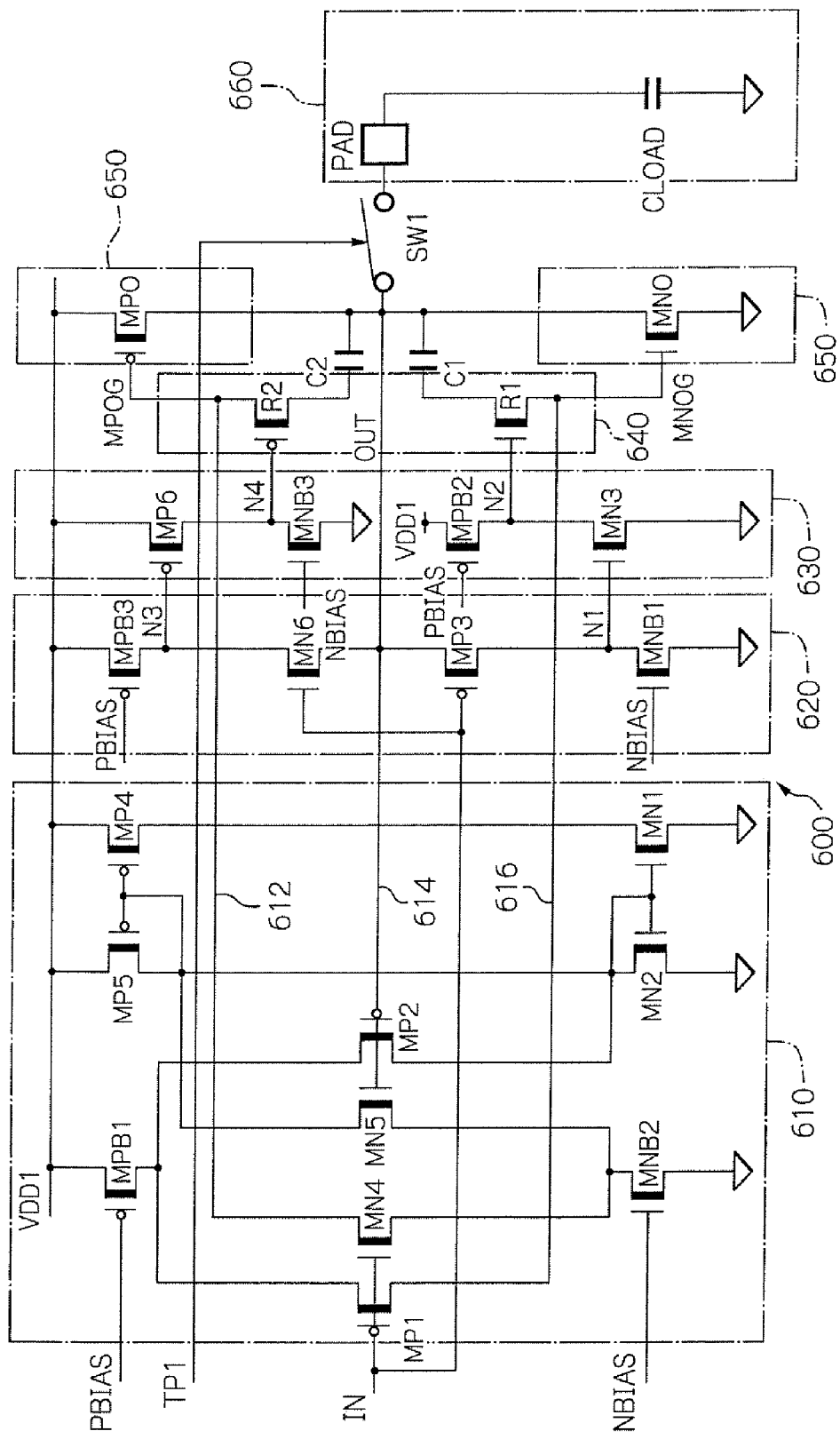
FIG. 6 is a schematic circuit diagram of an operational amplifier according to an alternative embodiment of the present invention.
Figure 7:
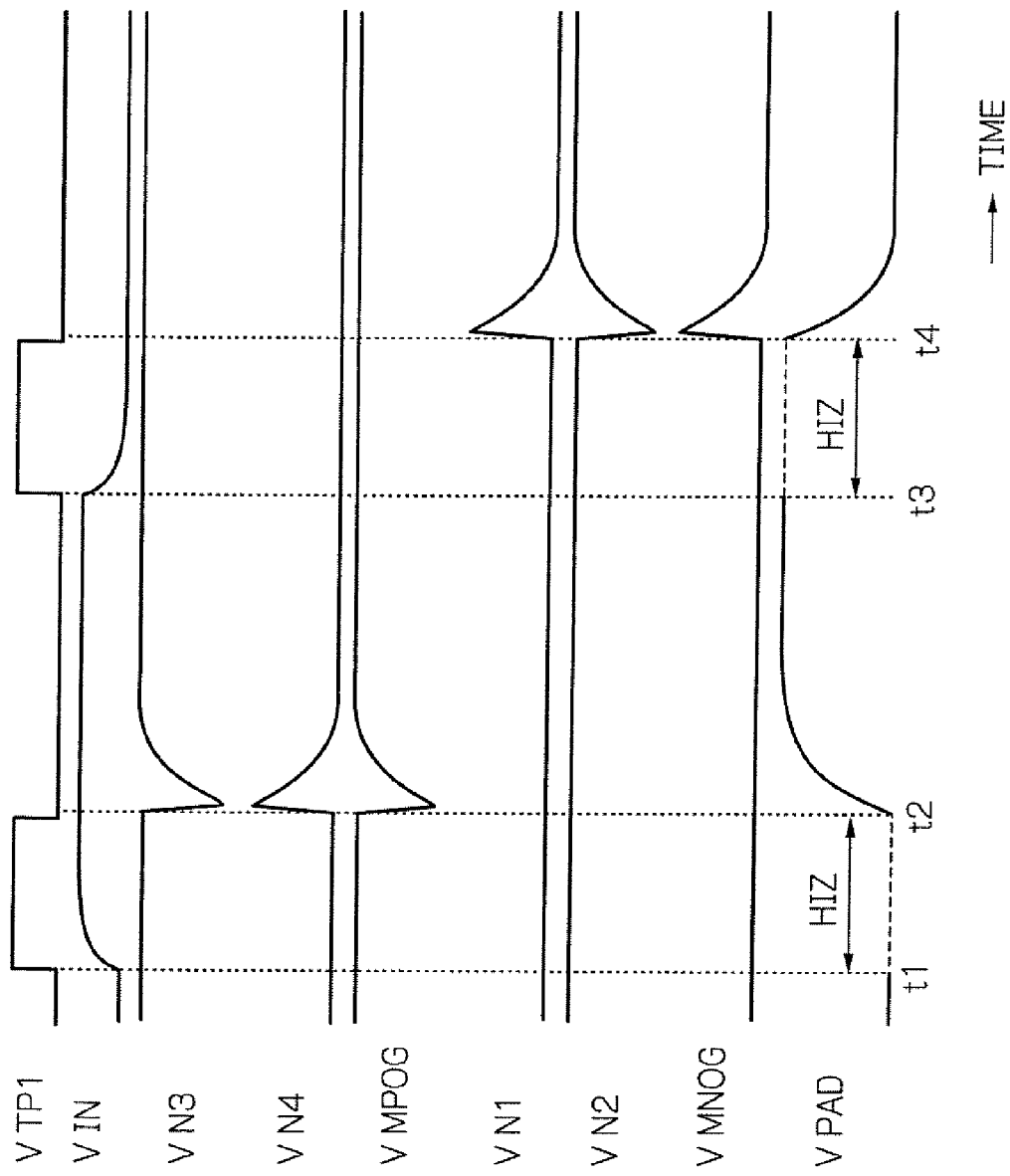
FIG. 7 is a timing chart of the operational amplifier shown in FIG. 6.

Next, an operational amplifier according to an alternative embodiment of the present invention will now be described with reference to FIGS. 6 and 7. FIG. 6i a schematic circuit diagram of an operational amplifier 600 of the present alternative embodiment. The operational amplifier 600 exhaustively involves the features of the illustrative embodiment and its modification described above. The operational amplifier 600 includes a differential amplifier 610, a detection circuit 620, a control circuit 630, a switching device 640, and an output circuit 650, which are interconnected as illustrated.

The differential amplifier 610 corresponds to the circuitry including the differential amplifier 10 of the embodiment earlier described and the differential amplifier 210 of its modification similarly described above interconnected so that the input ports IN of both amplifiers 10 and 210 form the input of the operational amplifier 600 and the output ports OUT of both amplifiers 10 and 210 form the output of the operational amplifier 600 and are further interconnected to the switching device 640 and the output circuit 650. The detection circuit 620 corresponds to the circuitry which includes the detection circuit 20 and the detection circuit 220 connected as illustrated. In a similar manner, the control circuit 630 corresponds to the circuitry including the control circuits 30 and 230 connected as illustrated, and the switching device 640 corresponds to the circuitry including the switching devices 40 and 240 connected as illustrated, while the output circuit 650 corresponds to the circuitry including the output circuits 50 and 250 connected as illustrated. The present alternative embodiment includes the compensator capacitances C1 and C2 as provided in the illustrative embodiment and its modification described above. In the description, like parts or components are of course denoted by the same reference numerals or symbols.

More specifically, the operational amplifier 600 has its input port IN connected to the input of the differential amplifier 610, and its output 612 forming the output of the differential amplifier 610 connected via a serial connection of the switching device 640 and the compensator capacitance C1 or C2. The output port OUT of the operational amplifier 600 is connected to the other input port 614 of the differential amplifier 610 to form a negative feedback path. The detection circuit 620 is connected between the input IN and the output OUT of the operational amplifier 600. The control circuit 630 is adapted to produce a signal conforming to the outputs N2 and N3 of the detection circuit 620 to the switching device 640 to control the switching device 640. The switching device 640 and the compensator capacitance C1 or C2 are connected in series between the output OUT of the operational amplifier 600 and the outputs 612 and 616 of the differential amplifier 610. The outputs 612 and 614 of the differential amplifier 610 are connected to the output circuit 650. The operational amplifier 600 is connected to a display device 660 via the switch SW1. In FIG. 6, the display device 660 is depicted with simplicity as including a pad and a capacitive load CLOAD serving as a liquid crystal display device.

The operation of the present alternative embodiment will now be described with reference to FIG. 7, which is a timing chart for the operational amplifier 600. When data is to be written in the liquid crystal capacitance of the display device 660, the input potential, if lower than the output potential, causes the operational amplifier 600 to operate in substantially the same manner as the embodiment shown in and described with reference to FIG. 2. If the input potential is higher than the output potential, then the operational amplifier 600 performs substantially the same operation as the modified embodiment described above.

In addition to the advantages attained by the previous embodiment and its modification, the operational amplifier in accordance with the present alternative embodiment may be adapted to operate as a rail-to-rail amplifier so that it is applicable to providing either of the positive- and negative-going output voltages.

In summary, the illustrative embodiments shown in FIGS. 2, 4 and 6 attain an operational amplifier which is superior in driving capability, or slew rate, with the power consumption maintained comparable to the type of operational amplifier adapted to transiently disconnect its compensator capacitance. The operational amplifier of the present invention has the advantages of high stability against oscillation and low cost, in contrast to the type of operational amplifier adapted to temporarily disconnect its compensator capacitance by an external signal. Moreover, in case the operational amplifier of the present invention is applied to a driver integrated circuit (IC) that is in need of the driving capability similar to the conventional driver IC, then the power consumption can be lower than the conventional driver IC. In addition, the operational amplifier of the present invention can exhibit desirable heat evolution performance.

The entire disclosure of Japanese patent application No. 2007-85461 filed on Mar. 28, 2007, including the specification, claims, accompanying drawings and abstract of the disclosure is incorporated herein by reference in its entirety.

While the present invention has been described with reference to the particular illustrative embodiments, it is not to be restricted by the embodiments. It is to be appreciated that those skilled in the art can change or modify the embodiments without departing from the scope and spirit of the present invention.

What is claimed is:

1. An operational amplifier responsive to an input for producing a corresponding output, comprising:
   an input port for receiving the input;
   an output port for producing the output;
   a differential amplifier connected between said input port and said output port;
   a phase compensator capacitance having one plate connected to said output port;
   a switching transistor connected between said differential amplifier and another plate of said phase compensator capacitance for controlling a connection between said differential amplifier and said output port;
   a control transistor for controlling said switching transistor; and
   a detection transistor operative in response to a potential difference between said input port and said output port for controlling said control transistor.

2. The operational amplifier in accordance with claim 1, wherein said detection transistor has a gate electrode connected to said input port and a source electrode connected to said output port.

3. The operational amplifier in accordance with claim 1, wherein said detection transistor is operative to the potential difference to be turned conductive to conduct a current to vary a potential at a drain electrode of said detection transistor.

4. The operational amplifier in accordance with claim 3, wherein said control transistor is responsive to a change in potential at the drain electrode of said detection transistor.

5. An operational amplifier responsive to an input for producing a corresponding output, comprising:
   an input port for receiving the input;
   an output port for producing the output;
   first and second differential amplifiers connected between said input port and said output port;
   first and second phase compensator capacitances having one plate connected to said output port;
   a first switching transistor connected between said first differential amplifier and another plate of said first phase compensator capacitance for controlling a connection between said first differential amplifier and said output port;
   a second switching transistor connected between said second differential amplifier and another plate of said second phase compensator capacitance for controlling a connection between said second differential amplifier and said output port;
   a first detection transistor operative in response to a potential at said input port which is lower than a potential at said output port by a first predetermined range or more to be rendered conductive;
   a second detection transistor operative in response to a potential at said input port which exceeds the potential at said output port by a second predetermined range or more to be rendered conductive;
   a first control transistor operative in response to said first detection transistor for controlling said first switching transistor; and
   a second control transistor operative in response to said second detection transistor for controlling said second switching transistor.

6. The operational amplifier in accordance with claim 5 wherein the first predetermined range corresponds to a threshold value of said first detection transistor, the second predetermined range corresponding to a threshold value of said second detection transistor.

7. The operational amplifier in accordance with claim 5 wherein each of said first and second detection transistors has a gate electrode connected to said input port and a source electrode connected to said output port.

8. A driver for driving a liquid crystal display device, comprising:
   a decoder for selecting an analog voltage responsive to digital data as an output; and
   an operational amplifier having an input port for receiving the output and an output port for outputting a voltage corresponding to the output to the liquid crystal display device,
   said operational amplifier comprising:
   a differential amplifier connected between the input port and the output port;
   a phase compensator capacitance having one plate connected to the output port;
   a switching transistor connected between said differential amplifier and another plate of said phase compensator capacitance for controlling a connection between said differential amplifier and the output port;
   a control transistor for controlling said switching transistor; and
   a detection transistor operative in response to a potential difference between the input port and the output port for controlling said control transistor.

9. A driver for driving a liquid crystal display device, comprising:
   a decoder for selecting an analog voltage responsive to digital data as an output; and
   an operational amplifier having an input port for receiving the output and an output port for outputting a voltage corresponding to the output to the liquid crystal display device,
   said operational amplifier comprising:
   first and second differential amplifiers connected between the input port and the output port;
   first and second phase compensator capacitances having one plate connected to the output port;
   a first switching transistor connected to said first differential amplifier and another plate of said first phase compensator capacitance for controlling a connection between said first differential amplifier and the output port;
   a second switching transistor connected to said second differential amplifier and another plate of said second phase compensator capacitance for controlling a connection between said second differential amplifier and the output port;
   a first detection transistor operative in response to a potential at the input port which is lower than a potential at the output port by a first predetermined potential range or more to be rendered conductive;
   a second detection transistor operative in response to a potential at the input port which exceeds the potential at the output port by a second predetermined range or more to be rendered conductive;
   a first control transistor operative in response to said first detection transistor for controlling said first switching transistor; and
   a second control transistor operative in response to said second detection transistor for controlling said second switching transistor.

* * * * *